(12) United States Patent
Takayama

(10) Patent No.: US 7,598,611 B2
(45) Date of Patent: Oct. 6, 2009

(54) SEMICONDUCTOR DEVICE WITH SIDE TERMINALS

(75) Inventor: Yoshiki Takayama, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/186,573

(22) Filed: Aug. 6, 2008

(65) Prior Publication Data

US 2009/0045495 A1 Feb. 19, 2009

(30) Foreign Application Priority Data

Aug. 15, 2007 (JP) .............................. 2007-211610

(51) Int. Cl.
*H01L 23/12* (2006.01)
*H01L 23/053* (2006.01)
(52) U.S. Cl. ....................... 257/730; 257/710
(58) Field of Classification Search ................. 257/701, 257/710, 730, 729, 776
See application file for complete search history.

(56) References Cited

U.S. PATENT DOCUMENTS

| | | | |
|---|---|---|---|
| 4,525,597 A | 6/1985 | Abe | 174/52 FP |
| 4,551,746 A | 11/1985 | Gilbert et al. | 357/74 |
| 4,616,655 A | 10/1986 | Weinberg et al. | 128/419 P |
| 5,388,029 A | 2/1995 | Moriyama | 361/760 |
| 6,204,554 B1 * | 3/2001 | Ewer et al. | 257/705 |
| 6,229,249 B1 | 5/2001 | Hatanaka et al. | 310/348 |
| 2001/0040287 A1 * | 11/2001 | Hosomi | 257/693 |
| 2002/0149099 A1 * | 10/2002 | Shirasaka et al. | 257/692 |
| 2003/0178723 A1 * | 9/2003 | Ito et al. | 257/735 |
| 2003/0227076 A1 * | 12/2003 | Sugimori | 257/670 |
| 2006/0055432 A1 * | 3/2006 | Shimokawa et al. | 327/5 |
| 2008/0174494 A1 * | 7/2008 | Suzuki et al. | 343/700 MS |

FOREIGN PATENT DOCUMENTS

| | | |
|---|---|---|
| JP | 61-123288 | 6/1986 |
| JP | 61-269336 | 11/1986 |
| JP | 2003-188365 | 7/2003 |

\* cited by examiner

*Primary Examiner*—S. V Clark
(74) *Attorney, Agent, or Firm*—Steptoe & Johnson LLP

(57) ABSTRACT

Side terminals 3 at respective corners of a package are higher than side terminals 4 on each side of the package. Thus, even if the side terminals 4 on each side are lower than those according to the conventional art owing to miniaturization or the like, when a device is mounted on a mounting substrate by soldering, a solder fillet 11 of a sufficient size can be formed between each of the corner side terminals 3, which significantly affect reliability, and a corresponding terminal on the mounting substrate. Thus, the device can be more reliably mounted on the mounting substrate by soldering.

17 Claims, 4 Drawing Sheets

SEMICONDUCTOR DEVICE WITH SIDE TERMINALS

FIELD OF THE INVENTION

The present invention relates to a semiconductor device with side terminals on side surfaces of a package.

BACKGROUND OF THE INVENTION

As miniaturization of electronic apparatuses has advanced recently, miniaturization has been increasingly required in semiconductor devices used in the electronic apparatuses. For example, in conventional optical devices, an optical element is housed in a recessed package, and protective glass or the like (hereinafter referred to as a transparent member) is used to seal the opening of the recessed package. The conventional optical devices are miniaturized by reducing the bonding width of the transparent member, the distance from the external edge of the transparent member to the external edge of the package, and the width of each side wall portion (hereinafter referred to as a rib) of the recessed shape. In contrast to this structure, there are disclosed optical devices having a structure in which a transparent member is secured directly onto an optical element and housed in a recessed package for further miniaturization.

Thus, the conventional optical devices are miniaturized by housing the optical element in the recessed package and reducing the bonding width of the transparent member, the distance from the external edge of the transparent member to the external edge of the package, and the rib width of the recessed shape, or by securing the transparent member directly onto the optical element and housing the resulting structure in the recessed package with the reduced rib. In these optical devices, when the element is mounted on the substrate, back terminals formed on the back surface of the package are joined to respective terminals on the substrate. However, only the junction between the back terminals and the substrate may fail to offer a sufficient mounting strength. Thus, side terminals extended from the respective back terminals may be provided on each side of the package. Then, the device may be mounted in the package by soldering such that solder filets are formed on the respective side terminals. Even in this case, disadvantageously, the conventional side terminals are not high enough, preventing the formation of solder filets large enough to ensure a sufficient, reliable mounting strength.

For example, if ceramic layers each having an internal wiring layer are laminated together to form a recessed package, through-via are formed to electrically connect wires between the laminates. The mounting strength may be affected by the reduced distance between each of the through-via and a corresponding penetrating portion (hereinafter referred to as a castellation) forming the side terminal. Thus, to ensure the appropriate distance between the through-via and the castellation, the castellations, and then the side terminals, need to be formed in a lower layer where the distance between the cancellation and the through-via formed in the upper layer does not affect the strength, or in a layer having no through-via. For that reason, the side terminals are much lower than those according to the conventional art. Consequently, when the semiconductor device is mounted on the mounting substrate by soldering, a solder fillet of a sufficient size is not formed between each of the side terminals and the corresponding terminal on the mounting substrate. Thus, disadvantageously, the solder fillets are likely to be broken, degrading reliability.

Furthermore, in order to improve mounting reliability, a method has been disclosed which sets the width of each of the terminals arranged at the opposite ends of a terminal row to be smaller than that of the other terminals. However, also in this case, the reduced height of the side terminals prevents a solder filet of a sufficient size from being formed between each of the side terminals and the corresponding terminal on the mounting substrate. Thus, disadvantageously, the solder fillets are likely to be broken, degrading reliability.

DISCLOSURE OF THE INVENTION

The present invention solves the aforementioned problems. An object of the present invention is to allow even a miniaturized semiconductor device to be sufficiently reliably mounted on a mounting substrate by soldering.

To accomplish this object, a semiconductor device with side terminals according to the present invention includes a chip sealed in a package and further includes a plurality of first side terminals serving as external terminals provided on each of side surfaces of the package, and a second side terminal serving as an external terminal provided at at least one corner of the side surfaces of the package, the second side terminal being higher than each of the first side terminals.

Furthermore, the first side terminals are formed in castellations on each of the side surfaces of the package.

Furthermore, a semiconductor device with side terminals according to the present invention includes a chip sealed in a package and further includes a second side terminal serving as an external terminal provided only at at least one corner of side surfaces of the package.

Furthermore, the second side terminal is provided at two of the four corners which are located opposite each other on a diagonal line.

Furthermore, the second side terminal is formed in a notch at the corner of the side surfaces of the package.

Furthermore, the package is formed in a recessed shape by laminating ceramic layers together and is sealed by a cover.

Furthermore, the cover is a transparent member.

Furthermore, the package is formed in a recessed shape by laminating ceramic layers together. The transparent member is secured directly to the top surface of the chip. The chip is housed in the package and sealed by filling a resin around the periphery of the chip and the transparent member.

Furthermore, the chip is an optical element.

DESCRIPTION OF THE EMBODIMENTS

Figure 1A:
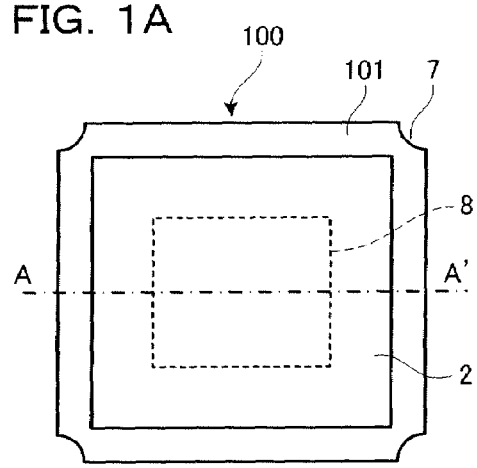
FIG. 1A is a diagram illustrating the configuration of a semiconductor device according to a first embodiment.

According to the present invention, side terminals are provided at corners of a package for a semiconductor device. The side terminals at the corners are set higher than those on each side of the package. The height of the side terminals at the corners is set such that when the semiconductor device is mounted, solder fillets large enough to achieve reliable solder connections can be formed. Normally, the semiconductor device is likely to peel off at the corners thereof. However, with the configuration of the present invention, even if the side terminals on each side of the package are lower than those according to the conventional art owing to miniaturization or the like, when the semiconductor device is mounted on a mounting substrate by soldering, a solder fillet of a sufficient size can be formed between each of the side terminals at the corers, which have significant effects on reliability, and a corresponding terminal on the mounting substrate. This improves the reliability of solder mounting on the mounting substrate.

If, for example, the package is formed by laminating ceramic layers together or castellations are provided to form the side terminals on each side, setting a sufficient distance from through-vias required for an appropriate strength may prevent the castellations from being formed in the upper part of the laminated ceramic layers. In this case, the castellations may be formed only in the lower laminated ceramic layers. This may prevent the side terminals on each side from having a height appropriate to form solder fillets of a sufficient size. In contrast, internal wiring and the through-vias through which the internal wiring is passed are generally not formed to extend to the corners of the package. Thus, the distance between each of the side terminals at the corners of the package and a corresponding internal terminal in the package is longer than that between each of the side terminals on each side and the corresponding internal terminal. This ensures a sufficient distance from the through-vias required for the appropriate strength, providing the side terminals with a height appropriate to form solder fillets of a sufficient size.

Embodiments of the present invention will be described with reference to the drawings. The drawings are schematic diagrams, and the dimensions and numbers of members shown in the drawings are different from those in an actual device. In the description of the embodiments below, an optical device is an example of a semiconductor device.

First Embodiment

Figure 1E:
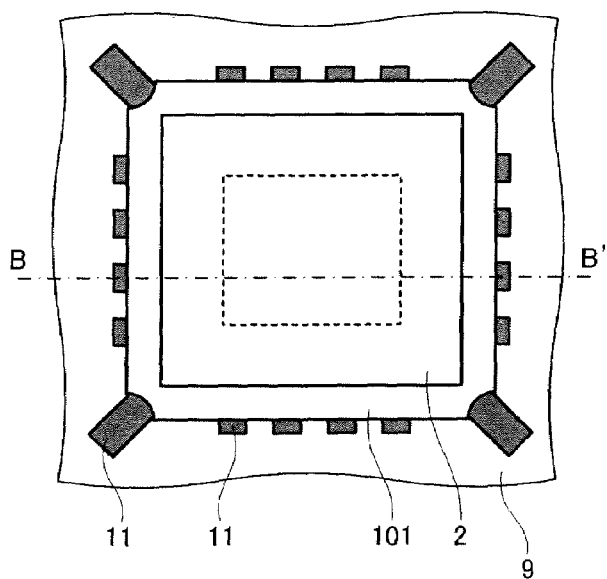
FIG. 1E is a diagram illustrating the configuration of the semiconductor device according to the first embodiment.
Figure 1B:
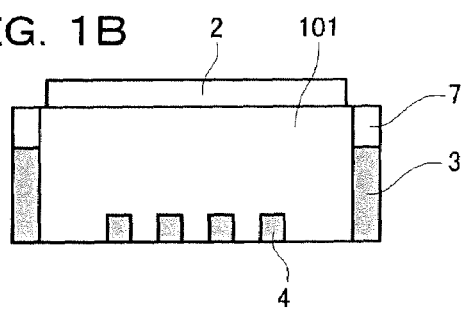
FIG. 1B is a diagram illustrating the configuration of the semiconductor device according to the first embodiment.
Figure 1C:
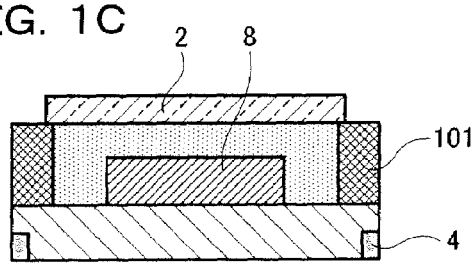
FIG. 1C is a diagram illustrating the configuration of the semiconductor device according to the first embodiment.
Figure 1F:
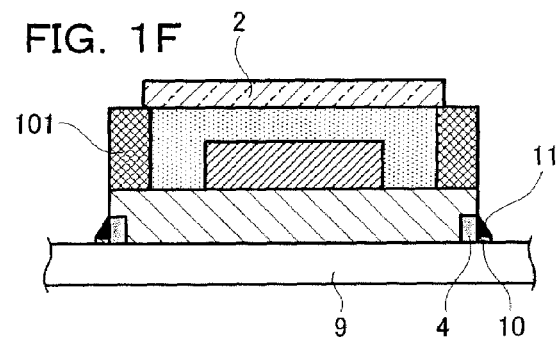
FIG. 1F is a diagram illustrating the configuration of the semiconductor device according to the first embodiment.
Figure 1D:
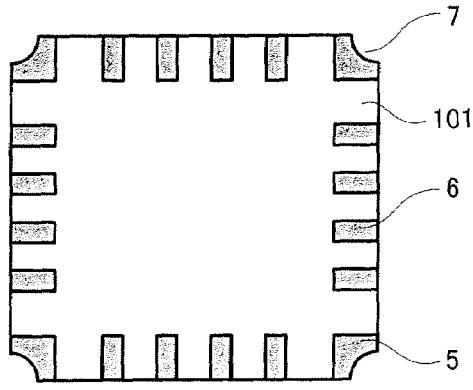
FIG. 1D is a diagram illustrating the configuration of the semiconductor device according to the first embodiment.
Figure 1G:
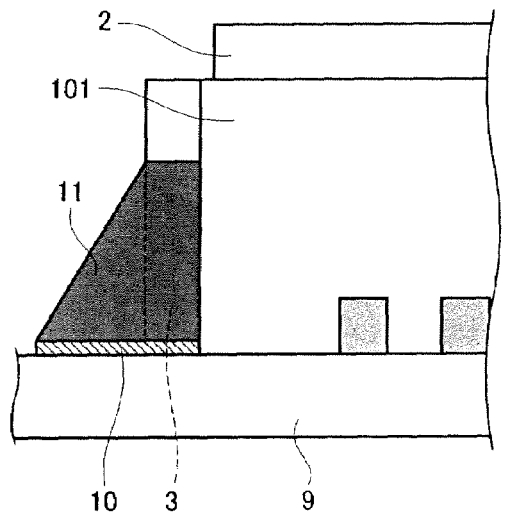
FIG. 1G is a diagram illustrating the configuration of the semiconductor device according to the first embodiment.

The configuration of an optical device according to a first embodiment of the present invention will be described with reference to FIGS. 1A, 1B, 1C, 1D, 1E, 1F, 1G, 4A, 4B, 4C, and 4D. FIGS. 1A to 1G are diagrams illustrating the configuration of a semiconductor device according to the first embodiment. FIG. 1A is a plan view showing the configuration of an optical device 100 according to the present embodiment. FIG. 1B is a side view of the optical device 100. FIG. 1C is a sectional view of the optical device 100 taken along line A-A' in FIG. 1A. FIG. 1D is a bottom view of the optical device 100. FIG. 1E shows a configuration in which the optical device 100 is mounted on a mounting substrate 9. FIG. 1F is a sectional view of the optical device 100 and the mounting substrate 9 taken along line B-B' in FIG. 1E. FIG. 1G is a side view showing that the optical device 100 is mounted on the mounting substrate 9. FIGS. 4A, 4B, 4C, and 4D are diagrams illustrating the shape of a notch in the semiconductor device according to the present invention.

As shown in FIGS. 1A, 1B, 1C, and 1D, in the optical device 100 according to the present embodiment, a chip 8 is housed in a package 101, and the top surface of the package 101 is sealed by a transparent member 2. External terminals of the optical device 100 include side terminals 4 on each side of the package 101, back terminals 6 on each side, side terminals 3 at the respective corners of the package 101, and back terminals 5 at the respective corners. Each of the side terminals 3 at the corners is higher than each of the side terminals 4 on each side. The package 101 is formed in a recessed shape and is formed by laminating, for example, ceramic layers together. In the case of the optical device, the top surface of the package 101 is sealed by the transparent member 2. However, in other cases, the top surface is sealed by any appropriate cover.

With this configuration, when the optical device 100 is mounted on the mounting substrate 9 by soldering as shown in FIGS. 1E and 1F, the side terminals 4 on each side may not be high enough to form a solder fillet 11 of a sufficient size between each of the side terminals 4 on each side and a corresponding terminal 10 on the mounting substrate 9. However, since the side terminals 3 at the corners in the external terminals at the corners, which have significant effects on reliability, are elevated as shown in FIG. 1G, the sufficient solder fillet 11 can be formed between each of the side terminals 3 at the corners and the corresponding terminal 10 on the mounting substrate 9 to improve the reliability of solder mounting.

Figure 4A:
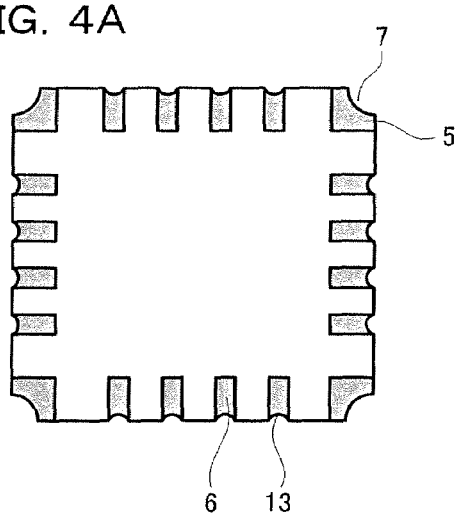
FIG. 4A is a diagram illustrating the shape of a notch in the semiconductor device according to the present invention.

In this case, the side terminals 4 on each side may be formed directly on each side of the package 101. However, as shown in FIG. 4A, the side terminals 4 may be formed in castellations 13 on each side. Furthermore, the castellations 13 may penetrate the package 101 from the top surface to the bottom surface thereof or may be formed only within the range in which the side terminals 4 on each side are formed and may not penetrate the package 101.

Figure 4B:
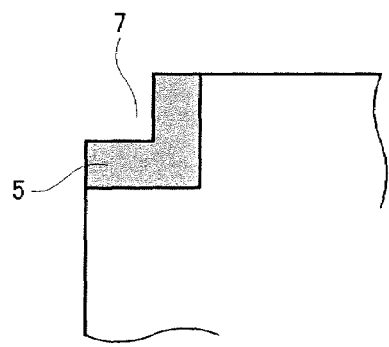
FIG. 4B is a diagram illustrating the shape of the notch in the semiconductor device according to the present invention.
Figure 4C:
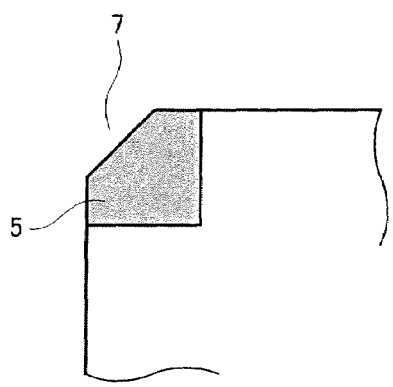
FIG. 4C is a diagram illustrating the shape of the notch in the semiconductor device according to the present invention.

Furthermore, corner notches 7 may be formed at the corners at which the corner side terminals 3 are formed. As shown in FIGS. 1D, 4B, and 4C, the corner notches 7 may have a circular cross section (FIG. 1D), a linearly truncated, chamfered cross section (FIG. 4C), or an orthogonally notched cross section (FIG. 4B), and the shape of the notch 7 is not particularly limited.

Figure 4D:
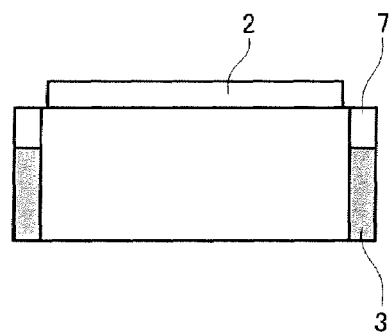
FIG. 4D is a diagram illustrating the shape of the notch in the semiconductor device according to the present invention.

Furthermore, even if the side terminals 4 on each side cannot be formed as shown in a side view in FIG. 4D, the reliability of solder mounting can be improved by forming only the side terminals 3 at the corners of the package so that the side terminals 3 are high enough to form solder fillets of a sufficient size during mounting.

Furthermore, the corner side terminals 3 are most effective when provided at the four corners. However, the corner side terminal 3 may be provided at at least one corner. Even if the corner side terminals 3 cannot be provided at the four corners, sufficient effects can be exerted by providing the corner side terminals 3 at two positions on at least one diagonal line.

Furthermore, the corner notches may penetrate the package from the top surface to the bottom surface or may be formed only within the range in which the corner side terminals 3 are formed and may not penetrate the package 101.

Furthermore, the corner side terminals 3 and the corner back terminals 5 may be signal or GND terminals that may be or may not be electrically connected together.

Second Embodiment

Figure 2A:
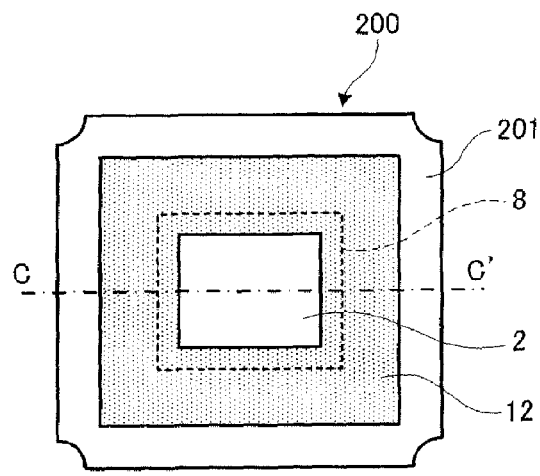
FIG. 2A is a diagram illustrating the configuration of a semiconductor device according to a second embodiment.
Figure 2B:
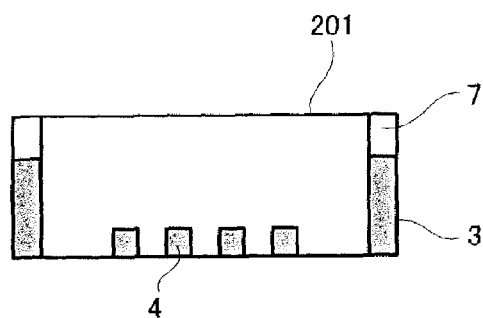
FIG. 2B is a diagram illustrating the configuration of the semiconductor device according to the second embodiment.
Figure 2C:
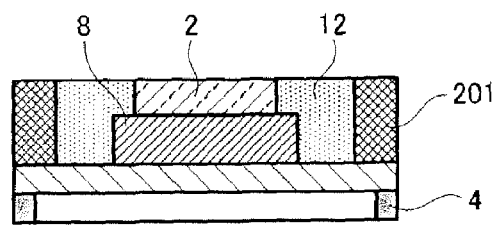
FIG. 2C is a diagram illustrating the configuration of the semiconductor device according to the second embodiment.
Figure 2D:
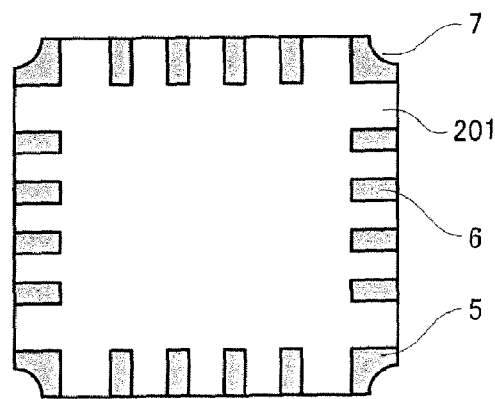
FIG. 2D is a diagram illustrating the configuration of the semiconductor device according to the second embodiment.

The configuration of an optical device 200 according to a second embodiment of the present invention will be described below with reference to FIGS. 2A, 2B, 2C, 2D, 4A, 4B, 4C, 4D, and 4E. FIGS. 2A, 2B, 2C, and 2D are diagrams illustrating the configuration of a semiconductor device according to the second embodiment. FIG. 2A is a plan view showing the configuration of the optical device 200 according to the present embodiment. FIG. 2B is a side view of the optical device 200. FIG. 2C is a sectional view of the optical device 200 taken along line C-C' in FIG. 2A. FIG. 2D is a bottom view of the optical device 200.

As shown in FIGS. 2A, 2B, 2C, and 2D, in the optical device 200 according to the present embodiment, a chip 8 having a transparent member 2 secured directly to the top surface thereof is housed in a package 201, with a resin 12 filled around the periphery of the transparent member 2 and the chip 8. External terminals include side terminals 4 on each side of the package 201, back terminals 6 on each side of the package 201, side terminals 3 at the corners of the package 201, and back terminals 5 at the corners of the package 201. The side terminals 3 at the corners are higher than the side terminals 4 on each side so as to allow a solder fillet of a sufficient size to be formed between each of the corner side terminals 3 and a corresponding terminal on a mounting substrate. The package 201 is formed in a recessed shape and is formed by laminating ceramic layers together.

With this configuration, the optical device 200 according to the present embodiment, the size of which is reduced by securing the transparent member directly on the chip, can exert effects similar to those of the first embodiment. The reliability of solder mounting can thus be improved.

The side terminals 4 on each side may be formed directly on each side of the package 201. However, as shown in FIG. 4A, the side terminals 4 may be also formed in castellations 13 on each side. Furthermore, the castellations 13 may penetrate the package 201 from the top surface to the bottom surface thereof or may be formed only within the range in which the side terminals on each side are formed and may not penetrate the package 201.

Furthermore, corner notches 7 may be formed at the corners at which the corner side terminals 3 are formed. As shown in FIGS. 2D, 4B, and 4C, the corner notches 7 may have a circular shape, a chamfered surface, or a rectangular shape, and the shape of the notch 7 is not particularly limited.

Figure 4E:
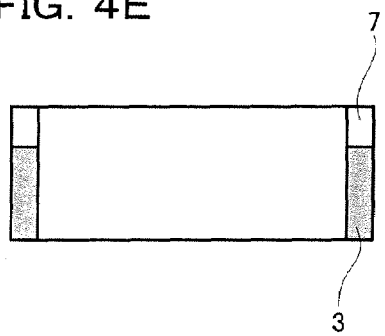
FIG. 4E is a diagram illustrating the shape of the notch in the semiconductor device according to the present invention.

Furthermore, even if the side terminals 4 on each side cannot be formed as shown in FIG. 4E, the reliability of solder mounting can be improved by forming only the side terminals 3 at the corners of the package so that the side terminals 3 are high enough to form sufficient solder fillets during mounting.

Furthermore, the corner side terminals 3 are most effective when provided at the four corners. However, the corner side terminal 3 may be provided at at least one corner. Even if the corner side terminals 3 cannot be provided at the four corners, sufficient effects can be exerted by providing the corner side terminals 3 at two positions on at least one diagonal line.

Furthermore, the corner notches may penetrate the package from the top surface to the bottom surface or may be formed only within the range in which the corner side terminals 3 are formed and may not penetrate the package 201.

Furthermore, the corner side terminals 3 and the corner back terminals 5 may be signal or GND terminals that may be or may not be electrically connected together.

Third Embodiment

Figure 3A:
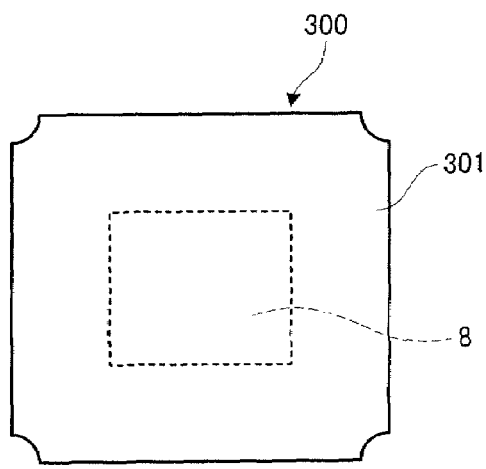
FIG. 3A is a diagram illustrating the configuration of a semiconductor device according to a third embodiment.
Figure 3B:
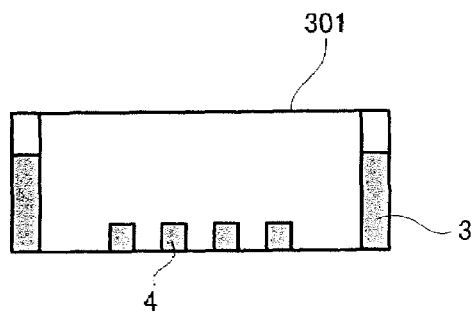
FIG. 3B is a diagram illustrating the configuration of the semiconductor device according to the third embodiment.
Figure 3C:
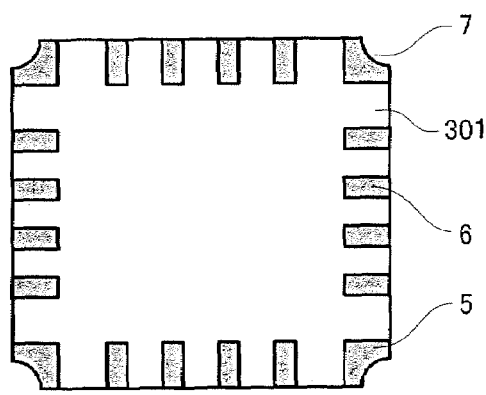
FIG. 3C is a diagram illustrating the configuration of the semiconductor device according to the third embodiment.
Figure 3D:
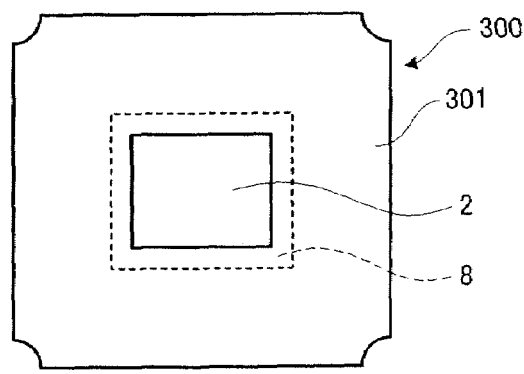
FIG. 3D is a diagram illustrating the configuration of the semiconductor device according to the third embodiment.

The configuration of a semiconductor device 300 according to a third embodiment of the present invention will be described below with reference to FIGS. 3A, 3B, 3C, 3D, 4A, 4B, 4C, 4D, and 4E. FIG. 3 is a diagram illustrating the configuration of the semiconductor device according to the third embodiment of the present invention. FIG. 3A is a top view showing the configuration of the semiconductor device 300 according to the present embodiment. FIG. 3B is a side view of the semiconductor device 300. FIG. 3C is a bottom view of the semiconductor device 300. FIG. 3D is a top view of the semiconductor device with the upper part of a package over a transparent member 2 open.

As shown in FIGS. 3A, 3B, and 3C, in the semiconductor device 300 according to the present embodiment, a chip 8 is housed in a package 301. External terminals include side terminals 4 on each side of the package 301, back terminals 6 on each side of the package 301, side terminals 3 at the corners of the package 301 and back terminals 5 at the corners of the package 301. The corner side terminals 3 are higher than the side terminals 4 on each side so as to allow a solder fillet 11 of a sufficient size to be formed between each of the corner side terminals 3 and a corresponding terminal on a mounting substrate.

With this configuration, even the semiconductor device according to the present embodiment exerts effects similar to those of the first embodiment. The reliability of solder mounting can thus be improved.

The package 301 may be formed by molding a lead frame or substrate, printing a resin on a substrate, potting, or the like. The method of forming the package 301 is not particularly limited.

The side terminals 4 on each side may be formed directly on each side of the package 301. However, as shown in FIG. 4A, the side terminals 4 may be formed in castellations 13 on each side. Furthermore, the castellations 13 may penetrate the package 301 from the top surface to the bottom surface or may be formed only within the range in which the side terminals 4 on each side are formed and may not penetrate the package 301.

Furthermore, corner notches 7 may be formed at the corners at which the corner side terminals 3 are formed. As shown in FIGS. 3C, 4B, and 4C, the corner notches 7 may have a circular shape, a chamfered surface, or a rectangular shape, and the shape of the notch 7 is not particularly limited.

Furthermore, even if the side terminals 4 on each side cannot be formed as shown in FIG. 4E, the reliability of solder mounting can be improved by forming only the side terminals 3 at the corners of the package so that the side terminals 3 are high enough to form sufficient solder fillets during mounting.

Furthermore, the corner side terminals 3 are most effective when provided at the four corners. However, the corner side terminal 3 may be provided at at least one corner. Even if the corner side terminals 3 cannot be provided at the four corners, sufficient effects can be exerted by providing the corner side terminals 3 at two positions on at least one diagonal line.

Furthermore, the corner notches may penetrate the package from the top surface to the bottom surface or may be formed only within the range in which the corner side terminals 3 are formed and may not penetrate the package 301.

Furthermore, the corner side terminals 3 and the corner back terminals 5 may be signal or GND terminals that may be or may not be electrically connected together.

In the present embodiment, if the chip 8 having the transparent member 2 secured directly to the top surface thereof is housed as is the case with the second embodiment, the upper part of the package over the transparent member 2 is open as shown in FIG. 3D.

What is claimed is:

1. A semiconductor device with side terminals comprising a chip sealed in a package, the semiconductor device further comprising:
   a plurality of first side terminals serving as external terminals provided on each of side surfaces of the package; and
   a second side terminal serving as an external terminal provided at at least one corner of the side surfaces of the package, the second side terminal being higher than each of the first side terminals.

2. The semiconductor device according to claim 1, wherein the first side terminals are formed in castellations on each of the side surfaces of the package.

3. A semiconductor device with side terminals comprising a chip sealed in a package, the semiconductor device further comprising:
   a second side terminal serving as an external terminal provided only at at least one corner of side surfaces of the package.

4. The semiconductor device according to claim 1, wherein the second side terminal is provided at two of the four corners which are located opposite each other on a diagonal line.

5. The semiconductor device according to claim 2, wherein the second side terminal is provided at two of the four corners which are located opposite each other on a diagonal line.

6. The semiconductor device according to claim 3, wherein the second side terminal is provided at two of the four corners which are located opposite each other on a diagonal line.

7. The semiconductor device according to claim 1, wherein the second side terminal is formed in a notch at the corner of the side surfaces of the package.

8. The semiconductor device according to claim 2, wherein the second side terminal is formed in a notch at the corner of the side surfaces of the package.

9. The semiconductor device according to claim 3, wherein the second side terminal is formed in a notch at the corner of the side surfaces of the package.

10. The semiconductor device according to claim 4, wherein the second side terminal is formed in a notch at the corner of the side surfaces of the package.

11. The semiconductor device according to claim 5, wherein the second side terminal is formed in a notch at the corner of the side surfaces of the package.

12. The semiconductor device according to claim 6, wherein the second side terminal is formed in a notch at the corner of the side surfaces of the package.

13. The semiconductor device according to claim 1, wherein the package is formed in a recessed shape by laminating ceramic layers together and is sealed by a cover.

14. The semiconductor device according to claim 13, wherein the cover is a transparent member.

15. The semiconductor device according to claim 1, wherein the package is formed in a recessed shape by laminating ceramic layers together, a transparent member is secured directly to a top surface of the chip, and the chip is housed in the package and sealed by filling a resin around a periphery of the chip and the transparent member.

16. The semiconductor device according to claim 14, wherein the chip is an optical element.

17. The semiconductor device according to claim 15, wherein the chip is an optical element.

* * * * *